(12) United States Patent
Ulrich et al.

(10) Patent No.: US 7,506,609 B2
(45) Date of Patent: Mar. 24, 2009

(54) SYSTEM FOR GENERATING A LOCAL ELECTRON-CYCLOTRON MICROWAVE LOW-PRESSURE PLASMA AT A PREDETERMINED LOCATION WITHIN A PROCESSING CHAMBER

(75) Inventors: Sven Ulrich, Stutensee (DE); Michael Stüber, Landau (DE); Harald Leiste, Weingarten (DE); Lorenz Niederberger, Heidelberg (DE); Konrad Sell, Karlsruhe (DE); Martina Lattemann, Tubingen (DE); Roland Loos, Furtwangen (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 129 days.

(21) Appl. No.: 10/847,555

(22) Filed: May 17, 2004

(65) Prior Publication Data

US 2004/0255867 A1      Dec. 23, 2004

Related U.S. Application Data

(63) Continuation-in-part of application No. PCT/EP02/11601, filed on Oct. 17, 2002.

(30) Foreign Application Priority Data

Nov. 17, 2001   (DE) ............................... 101 56 615

(51) Int. Cl.
    C23C 16/00      (2006.01)
    C23F 1/00       (2006.01)
    H01L 21/306     (2006.01)
(52) U.S. Cl. .................. 118/723 MW; 156/345.41; 156/345.42
(58) Field of Classification Search .......... 118/723 MA, 118/723 MR; 156/345.42
    See application file for complete search history.

(56) References Cited

U.S. PATENT DOCUMENTS

| | | | | | |
|---|---|---|---|---|---|
| 4,430,290 | A | * | 2/1984 | Kiryu | 376/134 |
| 4,778,561 | A | * | 10/1988 | Ghanbari | 216/70 |
| 4,842,707 | A | * | 6/1989 | Kinoshita | 204/298.37 |
| 4,947,085 | A | * | 8/1990 | Nakanishi et al. | 315/111.41 |
| 4,952,273 | A | * | 8/1990 | Popov | 216/70 |
| 5,003,152 | A | * | 3/1991 | Matsuo et al. | 219/121.59 |
| 5,115,167 | A | | 5/1992 | Ootera | |
| 5,198,725 | A | * | 3/1993 | Chen et al. | 315/111.41 |

(Continued)

FOREIGN PATENT DOCUMENTS

JP          63175426 A   *   7/1988

(Continued)

*Primary Examiner*—Parviz Hassanzadeh
*Assistant Examiner*—Rakesh K Dhingra
(74) *Attorney, Agent, or Firm*—Klaus J. Bach

(57) ABSTRACT

In an arrangement for generating a local electron-cyclotron-microwave-low pressure plasma at a certain location within a gas-filled process chamber, a microwave supply means providing a microwave beam and a plasma localization unit generating a magnetic field are provided such that the magnetic field and the microwave beam intersect each other in the process chamber. The microwaves are uncoupled onto a concave reflection structure from the focal point thereof so that the microwave beam generated is essentially parallel. An arrangement for generating a magnetic field is movable along the microwave beam axis so that a cross volume between the microwave beam and the magnetic field can be moved along the beam axis whereby the conditions for electron cyclotron resonance are adjustable by displacement of the magnetic field.

20 Claims, 4 Drawing Sheets

U.S. PATENT DOCUMENTS

| | | | | |
|---|---|---|---|---|
| 5,317,081 A | * | 5/1994 | Gelorme et al. | 528/353 |
| 5,366,586 A | * | 11/1994 | Samukawa | 216/70 |
| 5,954,882 A | | 9/1999 | Wild | |
| 6,010,755 A | * | 1/2000 | Suzuki | 427/571 |
| 6,105,534 A | * | 8/2000 | Siniaguine et al. | 118/723 EB |
| 6,308,654 B1 | * | 10/2001 | Schneider et al. | 118/723 I |
| 6,333,269 B2 | * | 12/2001 | Naito et al. | 438/706 |
| 2001/0008798 A1 | * | 7/2001 | Naito et al. | 438/689 |

FOREIGN PATENT DOCUMENTS

| | | | | |
|---|---|---|---|---|
| JP | 05163572 A | * | 6/1993 |
| JP | 05171448 A | * | 7/1993 |
| JP | 11167998 A | * | 6/1999 |

* cited by examiner

SYSTEM FOR GENERATING A LOCAL ELECTRON-CYCLOTRON MICROWAVE LOW-PRESSURE PLASMA AT A PREDETERMINED LOCATION WITHIN A PROCESSING CHAMBER

This is a Continuation-In-Part Application of International Application PCT/EP02/11601 filed Oct. 17, 2002 and claiming the priority of German application 101 56 615.8 filed Nov. 17, 2001.

BACKGROUND OF THE INVENTION

The invention relates to an apparatus for generating a local electron-cyclotron microwave low-pressure plasma at a predetermined location within a processing chamber of the apparatus. With the plasma generated in this way, the surface of an exposed substrate can be etched, modified, coated by a substance or structured.

Such systems or apparatus are highly important in connection with the plasma-based formation of layers or for the treatment of surfaces. The microwave energy is coupled in a pulsed form or continuously. How the microwave energy is supplied depends on the treatment process, or, respectively, the way of supplying the energy to an exposed substrate. A coating process for example magnetron sputtering, vapor deposition, or arc vaporization is supported in that a plasma is projected in front of the substrate to be coated. Furthermore, a substrate or a substrate surface may be modified as follows:

The surface of a substrate or a surface area of a substrate may be oxidized by an oxygen- or inert gas/oxygen plasma, by nitrating the surface or the surface area to a depth of several 100 μm, which can be achieved with a nitrogen or inert gas/nitrogen plasma; by borating the surface of the surface area of the substrate, which can be achieved by a chloro-boride, fluor-boride or inert gas/chloro-fluoride plasma, a boron containing gas plasma or a boron-containing inert gas plasma, but also a combination of the three mentioned possibilities.

WO 96/23318 discloses a plasma reactor for generating and maintaining a plasma in a hollow space resonator. This reactor is used for example in the thin film coating technology. With it, hard material layers, particularly diamond layers can be generated for the material synthesis and powder synthesis processes and nitration and etching in plasma surface treatments. The cross-section of the hollow space resonator becomes smaller in the apex area. The wall of the hollow space resonator is closed in the apex areas to such an extent that an excited field mode has in the area of the cross-section restrictions main maximas whose maximal field strength exceeds the field strength of the neighboring side maximas. In the area of a main maximum is a reaction unit with a substrate which is to be treated, that is, which is to be coated from the gas phase. Process parameters such as gas pressure and coupled-in magnetic energy can be selected to a large extent independently of one another if the position of the plasma is stable without an undesired discharge of the plasma in the side maxima of the field strength distribution in the resonator. The main maxima of the field strength distribution should be higher than the others to such a degree that a plasma discharge occurs only in those areas.

The hollow space resonator of the reactor has such a firm geometry that at least two main maxima occur in the field distribution where a discharge can be initiated. They must have a clearly greater height than the other maxima. Such a resonator geometry is in the complete ellipsoid or two parabolic parts each with an apex, which are coupled by way of a cylindrical intermediate part toward the hollow resonator space. At one of the focal points of the hollow space geometry a microwave is introduced; the plasma is formed at the other focal point which represents the load center. The plasma is generated by beam focusing without magnetic field influence and therefore associated with a rigid resonator geometry or respectively, two of such main maxima, a source and a sink.

It is the object of the present invention to provide a system for generating an electron cyclotron resonance microwave plasma in a vacuum apparatus wherein the location of the plasma can be controlled.

SUMMARY OF THE INVENTION

In an arrangement for generating a local electron-cyclotron-microwave-low pressure plasma at a certain location within a gas-filled process chamber, a microwave supply means providing a microwave beam and a plasma localization unit generating a magnetic field are provided such that the magnetic field and the microwave beam intersect each other in the process chamber. The microwaves are uncoupled onto a concave reflection structure from the focal point thereof so that the microwave beam generated is essentially parallel. An arrangement for generating a magnetic field is movable along the microwave beam axis so that a cross volume between the microwave beam and the magnetic field can be moved along the beam axis whereby the conditions for electron cyclotron resonance are adjustable by displacement of the magnetic field.

The apparatus is called in technical terms an Electron Cyclotron Resonance Microwave low pressure plasma Projection unit or short ECR-MP. It includes as novel feature the Microwave radiation device (MAV), which is provided with a microwave mirror and the plasma localization unit (PLE) which with its magnetic field crosses the reflected microwave beam at a predeterminable location along the radiation axis and forms a cross volume. In greater detail, the following components are present:

The microwave technical component which consists of a conventional microwave source/electron tube with wave guide and radiation device/antenna known in high-frequency engineering:

The mirror/reflector for the microwave.

The mirror has dish-like reflection surface and forms a part of an open conical area with an apex point or apex line which has a real focal point or real focal line covered by the reflection area. In the focal point or on the focal line, the uncoupling for the microwave is directed onto the mirror/reflection area. The reflection area is such that it reflects the microwave beam uncoupled at the mirror surface in the focal point or line to a beam with parallel-parabolic reflection area—or almost parallel radiation path. "Almost parallel" means that the reflected microwave beam may be slightly convergent or slightly divergent.

"Slightly divergent" means that the focus point or the focus line of the beam is in an unrestricted beam path outside the reaction volume.

The reflected microwave beam should have its virtual focus point or focus line appropriately far behind the mirror surface. Both focal points/lines, the real ellipsoidal and the virtual hyperbolical are unimportant for the process; they point for the sake of completeness to a geometric design of the reflector based on the cone section.

In connection with the vertex or focal point of a reflector one would also speak of a point radiator or point reflector, in connection with an apex line or focal line correspondingly of a line radiator or respectively line reflector.

The geometry just described is quite simple from a manufacturing point of view. The reflection surface area can be generated by rotation about a straight line extending through the apex- or focal point. In this way, the reflected beam has a circular cross-section. If the apex of the reflection surface area is a straight line and therefore has a focal line instead of a focal point, the cross-section of the reflected beam is, depending on the length of the line, oval or, respectively, elliptical to oblong with oval or respectively elliptically rounded corners if the apex or focal line is relatively long. Then, however, the reflection surface area cannot be generated simply by rotation but by a rotation about an axis normal to the apex- and focal line and, at the same time back and forth movement along the apex or focal line during rotation.

The kind of conical section on which the reflection surface areas are based determines the size of the cross-section of the reflected microwave beam. With the flat parabolic reflector, a large cross-section can be generated; with the pointed reflector a small cross-section can be generated. The same is true for a hyperbolic shape. With an ellipsoidal reflector, the eccentricity forms the cross-section of the reflected beam.

The substrate holder:

Within the substrate holder, the substrate is supported such that the surface area to be worked is exposed in the beam path of the reflected microwave beam that is it is pivoted in a certain position relative to the microwave plasma.

The evacuatable process chamber:

At least the substrate holder and possibly also the plasma-localization unit is arranged in the evacuatable process chamber. Its wall includes a wall with a microwave transparent window through which the reflected microwave beam passes and reaches the exposed substrate which is disposed in the chamber. Between this window and the substrate holder, the microwave beam crosses the outwardly-bent magnetic field as will be described below.

The microwave-transparent window may be in the free beam path of the microwave from the uncoupling up to the magnetic field. This window is always part of the wall of the process chamber since it separates any surroundings from the interior of the process space. In the uncoupling opening for the microwave, it would have the cross-section of the open cross-section of the uncoupling opening; the hollow conductor including the reflector would then be part of the wall of the process chamber. In the further beam path, the passage area of the window would simply be such that the local radiation cross-section is always completely accommodated.

The at least one unit for generating a timely constant magnetic flux $B_o$ or a time-variable magnetic flux $B_o$ (+).

The magnetic flux of each unit crosses the reflected microwave beam, that is, the radiation axis of the microwave crosses the axis of the respective magnetic field which is generally desirable that is they do not intersect but pass one another at a small distance, so that somewhere in the beam volume of the reflected microwave beam plasma discharge will occur. In this case, if several units for generating a magnetic field are present all magnetic fields disposed in the open extend relative to each other in such a way that, in the beam path of the microwave, they are not disposed one behind the other since plasma discharged in a cross-volume of magnetic field and microwave beam strongly absorbs the microwave depending on other process space parameters, particularly the gas density n.

In the interference area with the microwave beam the magnetic field has a bulgy shape so that a crossing volume of a cylinder or a somewhat truncated cone with a circular or elliptical/oval or oval-oblong cross-section is formed with the magnetic field bulge. In each of these interference or crossing volumes between the microwave beam and the respective magnetic field there is a partial volume of at least 0.5 cm$^3$ in which the plasma discharged expands as a result of the conditions therein and burns. In the radiation volume somewhere a normal component of the respective vector of the local magnetic induction B with respect to the wave vector k of the reflected beam of the microwave must fulfill the electron-cyclotron resonance condition. It is consequently not necessary that the magnetic field axis extends normal to the beam axis of the reflected microwave or respectively, it intersects the beam axis at a right angle. The technically simplest solution is probably when the magnetic field axis intersects the beam axis or the beam axis of the beam section of the reflected microwave, which is interactive, normally in the center between the poles or, respectively the two coils. An intersection which is not normal provides for special technical solutions. Each of these units represents in an interactive relationship with the microwave and the gas in the receiver, the process chamber, a plasma localization unit.

The ions are formed from the gas filling of the process chamber. The plasma charge carrier density $n_{plasma}$ depends in a first approximation on the magnetic flux density, the frequency $\omega_E$ of the microwave, the microwave energy, the gas pressure, the composition of the gas, the ratio the suction line of the pump system and the associated gas flux, the material of the chamber and possibly additional effects on the process.

SUMMARY OF THE INVENTION

If a plasma with an alternating magnetic field is generated and if the excitation frequency $\omega$ is in the area of the electron cyclotron frequency, an Electron-Cyclotron Resonance (ECR) develops. There the plasma than has an increased density $n_{plasma}$ and also a high degree of excitation. The electron-cyclotron frequency is:

$$\omega_{ez} = e_o/m_e \times B,$$

Wherein $e_o$ is the elementary charge and $m_e$ is the electron mass. At the location $\omega_{ez}$ or in the vicinity below thereof a plasma of very high particle density $n_{plasma}$ can be generated. The representation of the infraction index n—it is a measure for the plasma charge carrier density squared over the frequency $\omega_e$ has at the location $\omega_{ez}$ a simple pole position. If $\omega_E$ approaches from below this pole position higher and higher plasma charge carrier densities $n_{plasma}$ can be reached, theoretically under frictionless condition, becoming infinite. Beyond this position, the infraction index n squared is first negative but then changes through zero to positive and increases slightly with further increasing frequency. In principle, this frequency range above the zero value could also be utilized, but is of less interest with regard to the plasma particle density. The plasma density may also be optimized for the process by way of this method.

If the process chamber is flooded by the gas selected for the generation of the plasma up to the pressure desired for a particular process, the plasma can be ignited in a partial volume of cross volume by way of the microwave beamed into that volume.

The invention is also directed to various features, which are defined in the subclaims, such as the conical parabolic, ellipsoidal and by parabolic shapes of the reflection surfaces.

For a loss-free or low-loss reflection, the mirror surface itself consists of an electrically well conducting material or the whole mirror wall, if metallic, consists of such an electrically conductive material. The heat possibly generated during the reflection in the mirror area must be conducted to the environment by way of the wall and this is achieved in a simple way by surface area increasing means mounted on the outside in good heat transfer relationship therewith such as ribs, corrugated metal sheets or lamellas. The heat is then transferred to the ambient air which may be blown over the surface and is carried away.

For forced air cooling, it is advantageous when the outside of the mirror wall is surrounded in spaced relationship by a cover. The surface area increasing means may in that case be used as spacers so that a flow channel is formed between the outer mirror surface and the cover through which a coolant can be conducted. Whether the coolant is gaseous or liquid depends on what amount of heat has to be removed in what time period and with which technical expenditures. If the wall is metallic at the same time, a microwave shield would be provided.

The basic design provides for different setups. In one, the process chamber forms with the mirror a continuous wall and the microwave transparent window, which is part of the wall of the process chamber, excludes the microwave uncoupling and consequently the focal point from the process chamber. In another setup, the process chamber is not directly in contact with the microwave mirror. The microwave technical shielding would then have to be provided separately and, depending on the wall material would require only shielding of the volume between the mirror and the process chamber if the process wall were metallic. It would include the process chamber if the process chamber would consist of a dielectric material.

If the unit for generating the magnetic field is movable along the beam axis of the reflected microwave beam, the cross volume and, as a result, the plasma volume can be moved along the beam axis as desired. If there are several magnetic fields at the outside, it is the beam axis of the beam section which is engaged in the interaction. The crossing volumina of the respective interactions microwave-magnetic field are always uncovered as seen from the reflector that is they are arranged side-by-side, stepwise displaced but not disposed one behind the other since, at each cross volume, the maximally possible amount of microwave energy is to be introduced. This is a substantial advantage for optimizing the process at the exposed substrate surface.

The respective unit for generating the magnetic field may be within or without the process chamber. If it is outside, that is, coils and or poles are disposed outside the process chamber, it is additionally only required that the wall of the process chamber consists of a non-magnetic material. The position of the unit is determined mainly by a design point of view particularly taking into consideration ease of operation and high operational reliability.

The unit for generating the respective magnetic field is preferably a permanent magnet. The reflected microwave beam passes between the poles and forms a cross-volume with the magnetic field which is time-constant and expanded in that area. Generally, the magnetic field axis will be straight in that area that is, the respective front areas of the two poles are disposed vertically opposite each other. By the shape of the front areas, the width of the magnetic field therebetween can be more or less developed within limits. Generally, the two front areas are planar. But a simply curved magnetic field axis would also be possible as long as a sufficiently strong magnetic field or magnetic induction B for the plasma generation can be provided in a minimum partial volume of the cross-volume.

As unit for the generation of the magnetic field, two coils may be provided which are disposed on a common axis and between which the reflected microwave beam passes. For example, an arrangement of the type of a Helmholtz coil pair or a modification thereof may be utilized. Generally, with coils—in contrast to permanent magnets—a time-variable magnetic field can be provided.

For guiding the magnetic flux, also a coil with an iron core is suitable which includes a gap through which the reflected microwaves pass. The gap in the iron core can be formed like the space between the poles of the permanent magnet. Another such arrangement is the construction of such a guide structure of superconductive or high temperature super conductive components. This however requires cryo-technical equipment for maintaining the temperature conditions below the critical temperature Tc for superconductivity. This requires technical and design expenditures which are justified only if a process can be realized only by using such a technology.

Based on these considerations, the combination of a permanent magnet and a pair of coils has been developed by way of which a time-dependent magnetic field can be generated in a simple manner. The respective magnetic field axis of the three magnetic field generating components, the coil pair and the permanent magnet are disposed on a common axis. Between the two coils, there is the gap of the permanent magnet. Strong permanent magnets are available with which a small-volume unit can be constructed. Such materials are present for example in the material systems samarium-cobalt or neodymium-iron-boron.

At least for examination and development projects, it is advantageous if the substrate holder which is mounted in the process chamber has sufficient degrees of freedom of translation and rotation. Sufficient for free movement and adjustment are:

Two translatory movements normal to the beam axis, one translatory movement along the beam axis, a rotational movement normal to the beam axis and a rotational movement in the direction of the beam axis. In this way, the exposed surface of the substrate can be brought into almost any suitable position with respect to the incident microwave beam or, respectively, the plasma volume. For simple predetermined processes, for example for the manufacture of a substrate in large numbers this multitude of degrees of freedom is safely examined.

For industrial manufacturing processes, the substrate holder mounted in the process chamber may be a revolving structure by which a substrate or substrates supported therein can be pivoted into any particular position with regard to the microwave plasma or to one of the microwave plasmas. For all-around processing of the surface, each mounted substrate can additionally be rotated about itself.

The mirror, that is, actually only its reflection surface requires for an as much as possible ideal reflection a corresponding quality of the reflection layer. It consists therefore at least of a layer or at least of a wire mesh of small mesh width with respect to the wavelength of the microwave and of a material with good electric conductivity such as silver, copper, gold or aluminum, iron or alloyed iron. As a result, the reflection area has also good heat conductivity so that, in connection with adjacent materials of good heat conductivity, the heat generated at the reflection surface can be conducted away.

However the mirror is constructed, for aggressive atmospheres, the reflection surface can be coated by a thin dielectric material, which is inert with regard to such an atmosphere, or the metallic surface may be coated with a suitable noble metal so that on one hand, protection is provided and, in the case of a dielectric coating, the dielectric losses can be kept low.

Even carbon may be used as material for the reflection surface. In this case, the mirror, that is the reflection surface itself could consist of graphite and could be coated by a hydrogenated carbon layer and/or an alloyed carbon layer forming a protection- and operational layer. The mirror may be constructed of carbon fiber, CFK. In comparison with metal, this would be advantageous as to weight and would facilitate construction but provide at least the same rigidity as metal.

The microwave window is an important part of the arrangement. It must be transparent for the microwaves. Negligible losses in the transmission would be tolerable. Forced cooling of this component for the removal of heat should be provided for only if absolutely necessary since this always involves technical expenditures which require space and costs. As window material quartz glass or aluminum oxide are suitable. An excellent material is diamond which however is expensive. Other materials, which are sufficiently microwave transparent and mechanically suitable for the construction, are not excluded and may be considered depending on the circumstances.

The microwave shielding toward the outside can be provided for by various designs. It may be for example a surround structure which has no other function. It may also be an integrated structure wherein the reflector is part of the process chamber wall and both parts are metallic. The reflector and the process chamber wall are metallic and in any case have good electric conductivity and are interconnected all around by a microwave-tight lattice structure. Windows in the process chamber wall also must be covered by such a microwave-tight lattice structure which is in contact with the walls if there is no all around shielding.

At any flange present at the wall of the process chamber, additional functional units can be attached which are to be used for the surface treatment process. The equipment can be combined with PVD and CVD coating sources or may be part thereof (PVD=Physical Vapor Deposition; CVD=Chemical Vapor Deposition). PVD and CVD sources are for example magnetron sources, arc vaporizers, or other vapor sources such as resistance or electron beam vaporizers. The arrangement can be used in combination with all connected types ion cannons, all types of plasma beam sources, all types of ion implantation sources and all plasma etching units. If particularly between the source and substrate a large distance is required, an intense plasma can still be generated if necessary. Such a large distance may be necessary if several sources are necessary for a process or if a process must be performed with such an arrangement in which several radiation sources participate which are all directed toward the substrate. At the substrate in the way, an intense plasma can be generated since almost all of the energy that can be coupled in is supplied directly to the plasma. Then, a plasma with high ion-electron radical particle density is present. If a plasma is present directly at the source which extends up to the substrate, the ion- and radical particle density as well as the particle density excited by the plasma becomes smaller toward the substrate.

With the point reflector, a compact cross volume of interaction can be established whereas with the line reflector, an elongated cross-volume is generated. This is advantageous for surface treatment processes of elongated objects since then a coherent uniform microwave plasma can be generated on the exposed side of a substrate over the length thereof. This can be done in approximation also with adjoining point reflectors but it would result in relatively high equipment expenses, particularly for a number of microwave sources.

Below, the arrangement according to the invention will be described in detail on the basis of the accompanying drawings.

DESCRIPTION OF THE VARIOUS EMBODIMENTS

Figure 1:
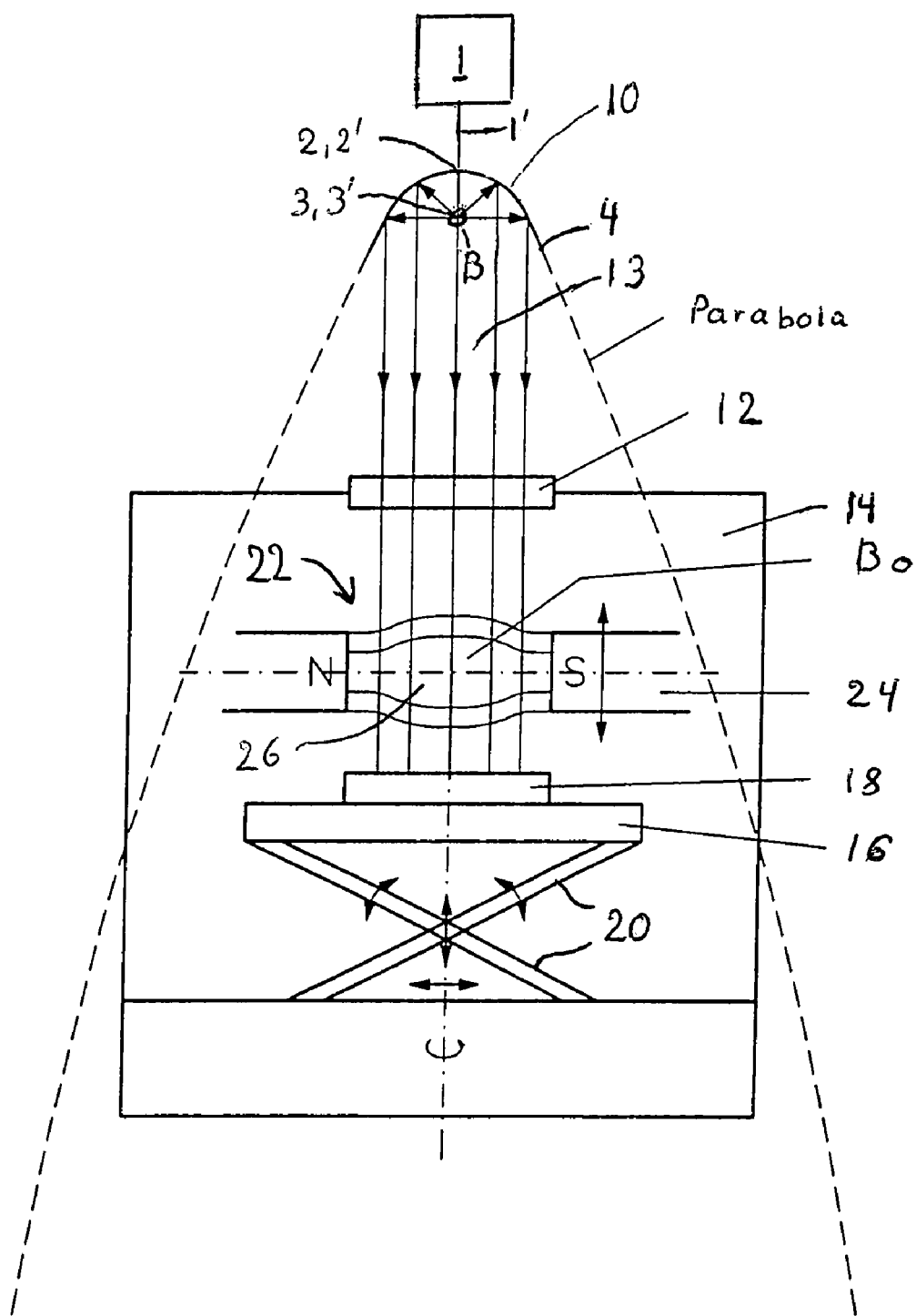
FIG. 1 shows schematically the arrangement with a parabolic reflector.
Figure 2:
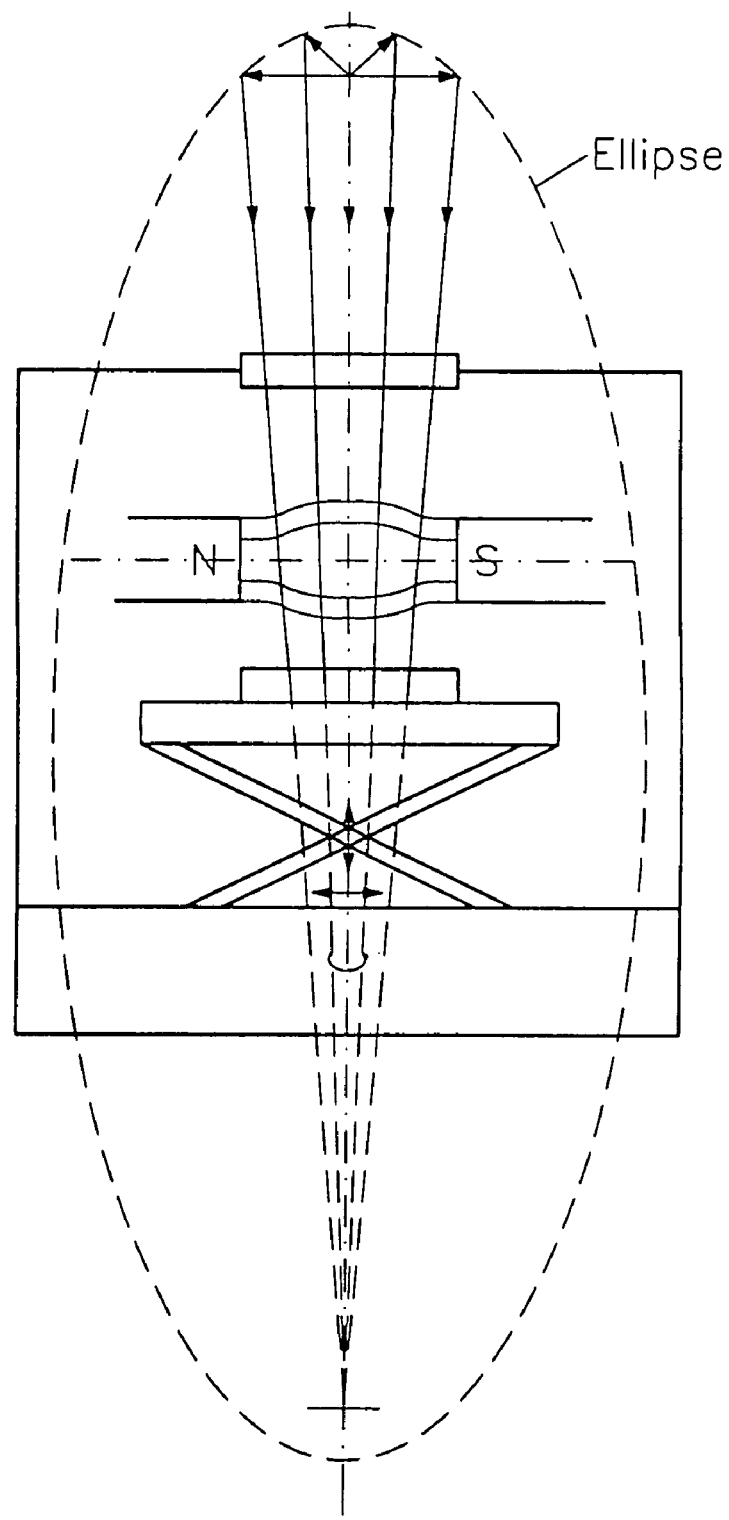
FIG. 2 shows schematically the arrangement with an ellipsoidal reflector.
Figure 3:
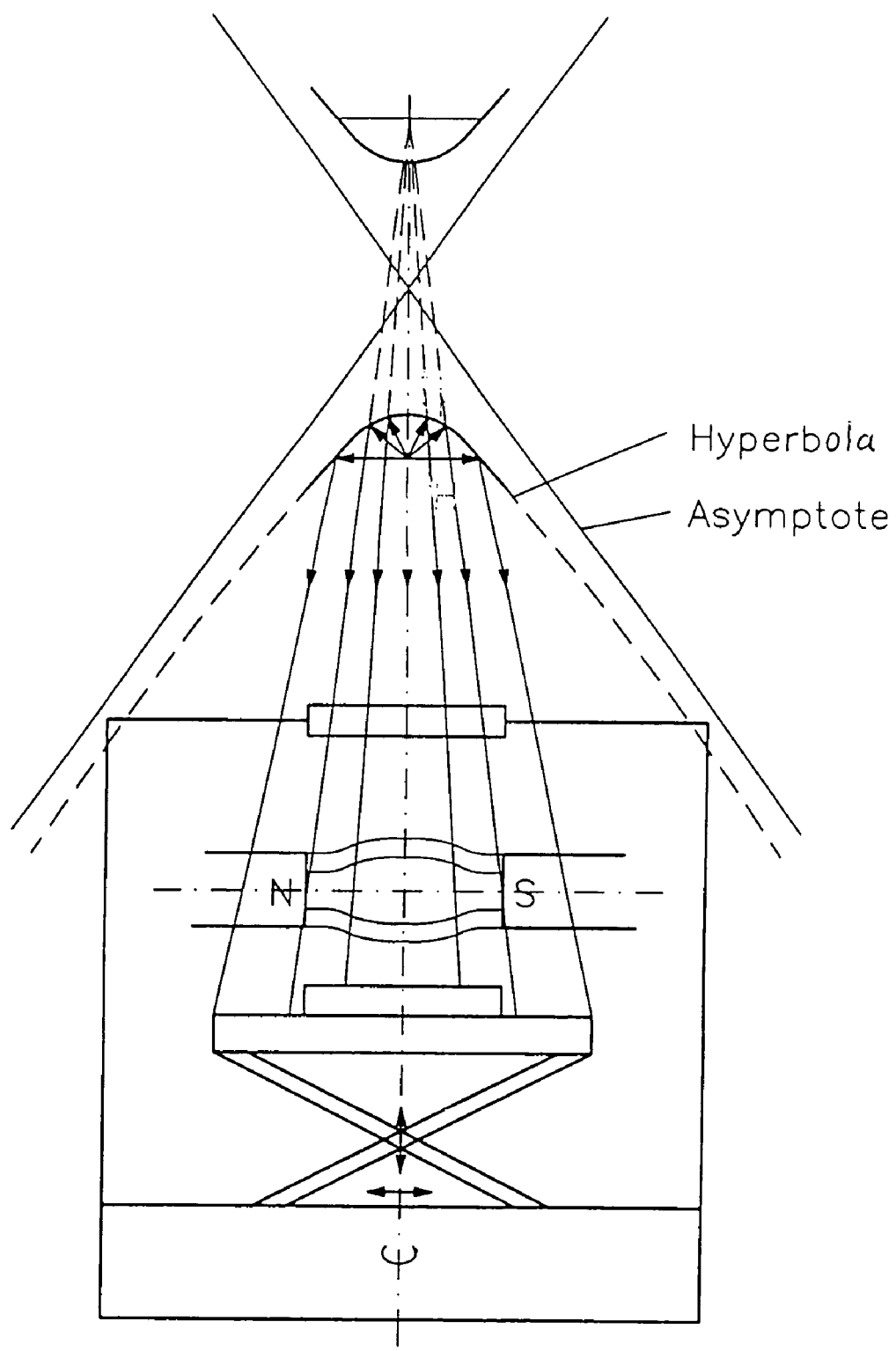
FIG. 3 shows schematically the arrangement with a hyperbolic reflector.
Figure 4:
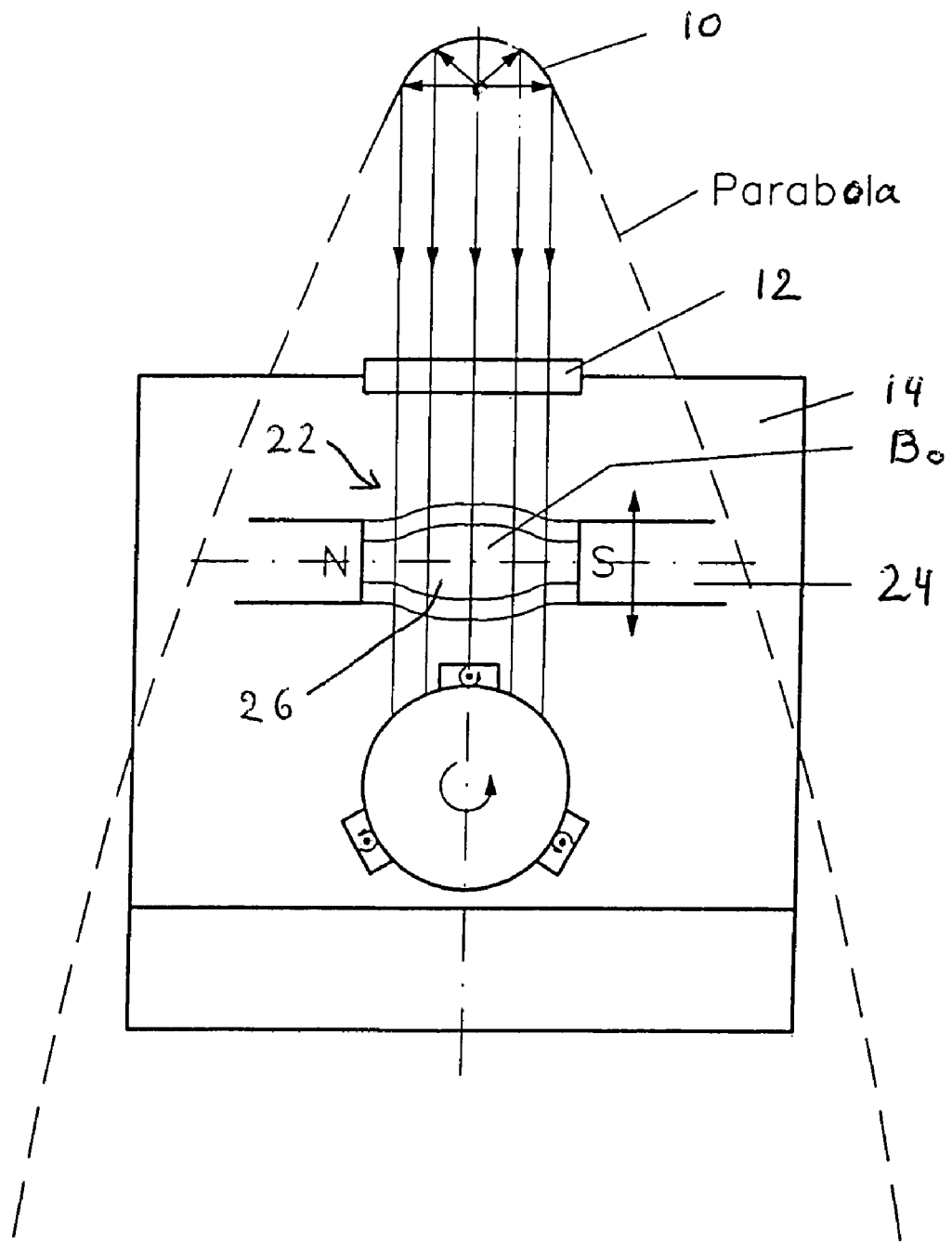
FIG. 4 shows the arrangement with a revolving substrate holder.

FIGS. 1-4 show the arrangement schematically in the simplest technical form in order to clearly present the novel concept that is the arrangement of a microwave radiation emitting apparatus 1 with a waveguide 1' and a radiation emission structure B and with the plasma localization unit in the path of the reflected microwave beam. With the exception of the reflectors, FIGS. 1 to 3 are identical. FIG. 4 shows— representative for the other figures—a revolving substrate holder, which could be used in place of the substrate holder shown in FIGS. 1 to 3. In each figure, a cross-sectional view through the apex 2 and the focal point 3 of the reflector 10 is shown. With an apex line 2' and a focal line 3', the section extends normal to these lines; with a focal point 3, it extends through the apex point 2 and the focal point 3. In FIG. 1, the conical inner wall of the reflector 10 is part of a paraboloid, which is indicated by the parabola shown in dashed line.

In the focal point 3 of the reflector 10, the uncoupling opening of the microwave is so arranged that, after reflection a parallel microwave beam is formed. The microwave source and the hollow conductor with the uncoupling opening at its end are not shown since those components are well-known in the high-frequency technology.

The reflector and the process chamber wall are shown uncoupled. The reflector 10 is not a part thereof. The microwave permeable window 12 is arranged in the area of the parallel beam 13 of the microwave. As mirror, the parabolic reflector of an automobile front light is being used. For the microwave-tight enclosure, the process chamber 14 and the reflector 10 must be surrounded by an electrically conductive cage. If a lattice structure is used, the mesh width is smaller than ¼ of the wavelength λ of the microwave. If the wall of the process chamber 14 and also the reflector 10 are metallic, a microwave-tight contact between the reflector 10 and the process chamber wall would also provide for an enclosure.

The microwave window 12 for the admission of the microwave to the process chamber is disposed in the parallel microwave beam path between the reflector and ahead of the magnetic field (see FIGS. 1 to 4). In the example, the window 12 consists of aluminum oxide $Al_2O_3$ or of quartz glass. Both materials are almost fully transparent for microwaves with a frequency of 2.45 GHz which is used herein so that they are very suitable for the arrangement. The window 12 is shown in the figures as a planar panel. It may however have a different shape. In a particular embodiment, it is in the form of a cup which is placed directly over the microwave uncoupling in a vacuum-tight manner.

In the process chamber, there is the substrate holder or support table 16 which is shown herein as a plate which extends normal to the microwave beam. The plate is supported by a scissor linkage on the bottom wall of the process chamber. On the table surface facing the beam, the substrate 18 is supported so as to be exposed to the beam. The arrows at the scissor legs 20 of the table 16 indicate possible degrees of freedom for the lateral displacement or rotation of the table. This is advantageous for laboratory purposes. For industrial processes, degrees of freedom only as necessary for the particular process would be provided.

The magnetic field 22 generated by the magnetic field device 24 crosses only the parallel part of the microwave beam path 13 between the microwave window 12 and the substrate holder 16, or, if no window is present between the reflector 10 and the substrate holder 16. In this area, the magnetic field, that is the device 24 for generating the magnetic field, is movable along the axis of the parallel microwave beam 13. In FIGS. 1-4, this magnetic field generating device 24 is indicated only by the two poles N and S. Instead of N and S, also a pair of coils could be provided. Where the magnetic field generating device is arranged, within the process space or without, is a pure design matter. It is important however that along the beam axis of the parallel microwave beam, the cross volume 26 of the microwave beam and the magnetic field is formed. In the cross-volume 13o, there must be a field strength of 875 Gauss at the excitation frequency of $\omega_E$=2.45 GHz so that the electron-cyclotron-resonance (ECR) condition $\omega_{CE}$ based on the frequency is approximately generated therein.

What is claimed is:

1. An arrangement for generating a local electron-cyclotron microwave resonance (ECR) low pressure plasma at a predeterminable location within a process chamber (14), the arrangement comprising:
    a process chamber (14) with a microwave transparent window (12), through which a selected gas of a predetermined density n can be introduced into the process chamber,
    a microwave source (1),
    a microwave reflection structure (10) having a shell-like reflection area with a focal point or line (B) arranged opposite the microwave transparent window (12),
    a microwave guide (1') extending from the microwave source (1) to the focal point or line (B) and having an uncoupling opening in the focal point or line (B) for directing the microwaves directly onto the microwave reflection structure (10), so that a parallel microwave beam (13) is formed which is directed through the microwave transparent window (12) into the process chamber (14),
    a substrate holder (16) with a substrate (18) disposed thereon arranged in the process chamber opposite the microwave transparent window (12),
    a magnetic field generating device (24) including magnets having S- and, respectively N-poles arranged in the process chamber (14) at opposite sides of the microwave beam (13) between the substrate holder (16) and the microwave transparent window (12) and having a pole axis extending perpendicularly to the microwave beam (13) whereby the microwave beam (13) passes through a magnetic field ($B_0$) generated by the magnetic field generating device (24) and a cross volume (26) of at least 0.5 cm$^3$ is formed in which the magnetic field has such a strength, that the input microwave radiation with the excitation frequency $\omega_E$ is essentially equal to the electron-cyclotron frequency $\omega_{EZ}$ so that ECR conditions are established, wherein $\omega_{EZ}=e_0/m_e \times B_0$, $e_0$ being the elementary charge and $m_e$ being the electron mass so that a plasma of increased density is formed in the cross-volume (26),
    the magnetic field generating device (24) being movable together with the cross volume (26) in which ECR conditions exist along the microwave beam into direct interactive contact with the substrate (18).

2. An arrangement according to claim 1, wherein the reflection surface area is parabolic.

3. An arrangement according to claim 1, wherein the reflection surface area is ellipsoidal defining a second focal point or line which is disposed behind the substrate holder whereby the reflected microwave beam is slightly convergent.

4. An arrangement according to claim 1, wherein the reflection surface area is hyperbolical such that the reflected microwave beam is slightly divergent.

5. An arrangement according to claim 1, wherein the reflection surface area is provided at the outside with surface increasing means for improving the heat transfer to the ambient.

6. An arrangement according to claim 1, wherein an envelope is disposed on the outside of said reflection surface area in spaced relationship therewith such that a channel is formed through which a coolant can be conducted for improved heat removal from the reflection surface area.

7. An arrangement according to claim 1, wherein said process chamber (14) includes an opening covered by a window (12) and is so arranged that the window (12) is disposed in the path of the microwave beam such that the microwave beam can enter said process chamber (14).

8. An arrangement according to claim 7, wherein said process chamber (14) is not in direct contact with said reflection chamber (10).

9. An arrangement according to claim 1, wherein said magnetic field generating device is movable along the axis of the microwave beam reflected from said reflection device such that the area of the microwave beam which is in interaction with the magnetic field generated by the magnetic field generating means is adjustable.

10. An arrangement according to claim 9, wherein said magnetic field generating means is disposed either inside or outside the process chamber.

11. An arrangement according to claim 9, wherein said magnetic field generating means comprises a permanent magnet having spaced opposite poles so arranged that the axis of the microwave beam passes through the space between the two magnet poles.

12. An arrangement according to claim 9, wherein said magnetic field generating means comprises two same-type coils which are disposed on an axis which intersects the microwave beam axis.

13. An arrangement according to claim 9, wherein said magnetic field generating means comprises a coil with an iron core which has a gap through which the axis of the microwave beam extends.

14. An arrangement according to claim 9, wherein said magnetic field generating means comprises a pair of coils and a permanent magnet wherein the magnetic field axes of the three field generating components are disposed on an axis and the gap of the permanent magnet is arranged between the two coils.

15. An arrangement according to claim 1, wherein the substrate holder disposed in the process chamber has five degrees of freedom of movement, two translatory normal to the beam axis, a rotational normal to the radiation axis and a rotational in the direction of the beam axis.

16. An arrangement according to claim 1, wherein the substrate holder disposed in the process chamber is a revolving structure by which a substrate mounted thereon so as to be rotatable can be moved to various positions with respect to the microwave plasma.

17. An arrangement according to claim 1, wherein said microwave reflection structure (10) comprises a lattice structure which has a mesh width which is smaller than $\frac{1}{4}$ of the wave length $\lambda$ of the microwave and consists of a conductive material comprising silver, copper, gold, iron, and alloyed iron.

18. An arrangement according to claim 17, wherein the reflection surface area is coated by a layer of an inert material which does not negatively affect the microwave.

19. An arrangement according to claim 1, wherein the reflection surface area comprises one of a hydrogenised carbon layer and an alloyed carbon layer.

20. An arrangement according to claim 1, wherein said microwave window consists of one of quartz glass, aluminum oxide, and a diamond that is of a material which does not materially affect the microwave transmission.

* * * * *